United States Patent
Fisher et al.

(10) Patent No.: US 11,428,728 B1
(45) Date of Patent: Aug. 30, 2022

(54) LED LOAD VOLTAGE DETECTION APPARATUS AND METHOD

(71) Applicant: Hatch Transformers, Inc., Tampa, FL (US)

(72) Inventors: John Fisher, Tampa, FL (US); Soufiane Daoudiya, Gainesville, FL (US)

(73) Assignee: Hatch Transformers, Inc., Tampa, FL (US)

( * ) Notice: Subject to any disclaimer, the term of this patent is extended or adjusted under 35 U.S.C. 154(b) by 23 days.

(21) Appl. No.: 17/182,458

(22) Filed: Feb. 23, 2021

(51) Int. Cl.
*G01R 31/26* (2020.01)
*G01R 19/00* (2006.01)

(52) U.S. Cl.
CPC ..... *G01R 31/2635* (2013.01); *G01R 19/0084* (2013.01)

(58) Field of Classification Search
CPC .............. G01R 31/2635; G01R 19/0084
See application file for complete search history.

(56) References Cited

U.S. PATENT DOCUMENTS

| | | | |
|---|---|---|---|
| 7,183,839 B2* | 2/2007 | Saito | H03D 1/10 329/331 |
| 2012/0200300 A1* | 8/2012 | Lamb | H02H 3/20 324/537 |
| 2013/0002163 A1* | 1/2013 | He | H05B 45/3725 315/297 |
| 2014/0361696 A1* | 12/2014 | Siessegger | H05B 45/395 315/193 |
| 2021/0325444 A1* | 10/2021 | Chong | G01R 31/2635 |

* cited by examiner

*Primary Examiner* — Akm Zakaria
(74) *Attorney, Agent, or Firm* — V Gerald Grafe

(57) ABSTRACT

The invention generally relates to LED lighting fixtures and provides apparatuses and methods for determining the forward voltage of a light emitting diode or light emitting diode array in a light fixture. An example apparatus comprises a boost converter with a user-variable forward bias current, that measures and displays the characteristics of an arbitrary LED load. Example methods according to the invention use a configurable boost converter apparatus in the field to determine the LED characteristics of an arbitrary LED module in a lighting fixture and subsequently display the results to the user. The apparatus can be part of a system that includes a link to a mobile device to transmit operating characteristics of the LED load and retrieve pertinent commercial data.

16 Claims, 8 Drawing Sheets

LED LOAD VOLTAGE DETECTION APPARATUS AND METHOD

TECHNICAL FIELD

This invention relates to the field of LED lighting, more specifically to systems for the determination of load voltage in an LED load.

BACKGROUND

As LED lighting systems in the market mature, it is inevitable that components in the LED lighting system will fail. Other than the housing and wiring, LED lighting system comprise primarily two critical components—an LED driver and an LED module. The predominant system device failure is the LED driver itself. LED driver failures can occur due to a variety of reasons, such as mains overvoltage conditions, unexpected environmental exposure levels outside the normal rating of the LED driver, or random component failure.

When an LED driver fails, restoring the system to proper functionality involves replacing the LED driver. Ideally this would involve replacing the LED driver with the exact model number that failed. However, this can be problematic if the LED driver manufacturer is no longer in business, is an unknown supplier, the specific model is no longer available or simply an out-of-stock condition. Typically, constant current LED drivers will have the specific rated output current printed on the label. These constant current drivers operate within a load voltage range, as LED modules in lighting luminaires consist of multiple light emitting diodes resulting in load voltages that are characteristic of LED arrays. Because of the differences in constant current driver designs, the output voltage ranges of most LED drivers do not coincide.

Due to design differences of constant current LED drivers and to properly select the correct constant current LED driver, it is important to know the forward bias voltage of the LED light source. This forward bias voltage is also known as the load voltage. Most constant current LED drivers will have an output voltage range of which the LED driver will operate normally. However, there are no industry standards for what the output voltage range of LED drivers should be. Further, the actual operational load voltage of an LED module can be associated with a non-arbitrary forward bias point. This forward bias point is the forward voltage at which the LED load will begin to conduct current.

For a constant current driver, the output voltage increases to the point at which the output corresponds to a pre-configured level. Up to a particular point, no current will be drawn by the LED load. Once conduction begins however, the performance of an LED load is such that very small increases in voltage from the LED driver will result in very large increases in current and similarly, in lumen output.

In the case of replacing a failed LED driver in a lighting system, it is very important to know the LED module forward bias voltage so that the proper LED driver can be selected as a replacement. An LED module forward bias voltage, or load voltage, outside the output voltage range of the LED driver is undesired and may result in abnormal lighting system behavior such as flicker or can result in damage to the LED load. The problem that exists is how to determine the LED module load voltage in the field, given that the native LED driver has failed and the best that can be hoped for is that the LED driver output voltage range is printed on the cover of the LED driver.

Further, for personnel involved in replacing LED drivers, it is important to be able to quickly access available commercial data such as cost, availability and model numbers of suitable replacement LED drivers, based on the information provided by the apparatus.

There is a need for an apparatus and method to accurately determine the forward bias voltage, or load voltage, of a LED module, and a system that can quickly provide commercial data for a suitable replacement.

SUMMARY OF THE INVENTION

Embodiments of the present invention provide an apparatus comprising a circuit that can be connected to an LED module to determine the load voltage and desired operating point of the LED module, independent of how the LED module is configured.

Embodiments of the present invention provide a system that allows a service technician or electrician to use a smart phone or similar device attached, via cable or wireless link, to a LED load voltage determining apparatus to enter and or display LED load parameters and subsequently interface wirelessly to a remote database that then provides pertinent commercial data regarding compatible LED driver constant current part numbers.

Embodiments of the present invention provide a method of determining the forward bias voltage of an LED module for facilitating LED driver replacements in an LED fixture.

Embodiments of the present invention provide a method of determining the desired operating point of an LED module for facilitating LED driver replacements in an LED fixture.

Embodiments of the present invention provide a method for a service technician or electrician to obtain LED load voltage information via an apparatus and keypad entry, transmit said information and in response receive pertinent commercial data regarding compatible part numbers.

DETAILED DESCRIPTION OF THE INVENTION

When an LED fixture in the field fails it is typically due to the LED driver. Many LED fixtures utilize constant current drivers. It is desirable to replace the failed driver with the exact manufacturer part number. However, for many reasons the original OEM model might not be available. Further, it is typically unlikely that there will be exact matches in the output voltage range between the LED driver that failed and any available constant current driver of the same output current that is available. Therefore it is important to know the approximate forward voltage of the LED module in the fixture.

Figure 1:
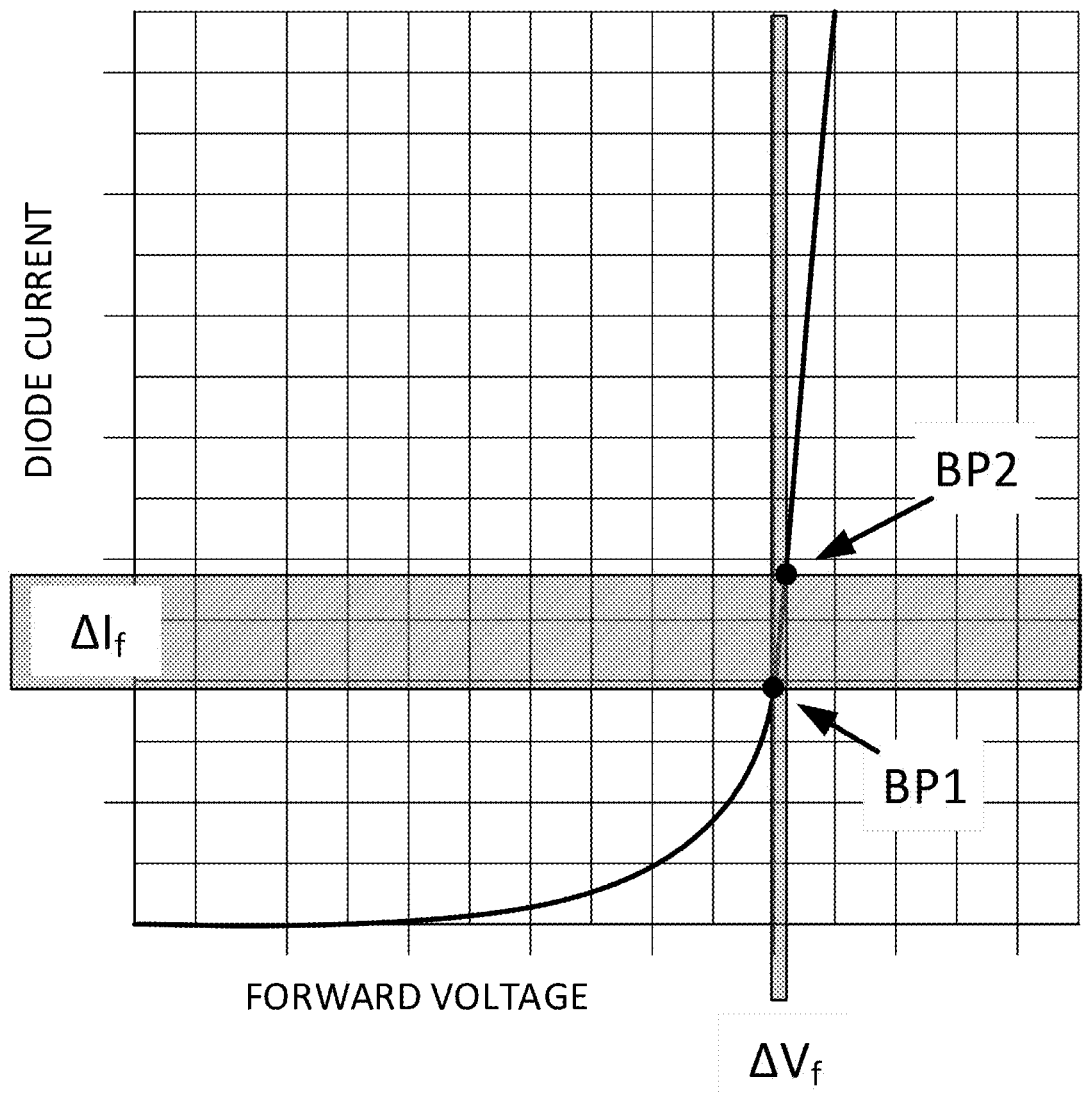
FIG. 1 is an illustration of a diode voltage-current relationship and diode forward bias points.

FIG. 1 is an illustration of a typical V/I curve of a diode. Light emitting diodes, or LEDs, behave in the same manner. No current passes through the LED until a forward bias voltage is exceeded. Once current passes through the LED, the amount of light will begin to exponentially increase, proportional to the increase in current. As can be seen in FIG. 1, this is indicated by the large change in $I_F$ for the very small change in $V_F$. Note specifically that LED modules, which consist of parallel strings of serially-connected individual LEDs, or a complex matrix of LEDs, behave in a similar manner.

FIG. 1 also depicts bias operating points BP1 and BP2. Noting that these two operating points can be compared to observe that a large increase in current has occurred for a very small change in forward voltage. This concept clearly illustrates that the diode (or LED, or LED module) is in a forward bias condition.

Therefore, to determine the forward voltage of the LED module, an apparatus is needed that provides an increasing voltage across the LED module up to an arbitrary reference current that corresponds to and indicates that the LED is becoming forward-biased. Once the LED voltage reaches a steady state condition at the reference current, this point is coincident with the LED load forward bias voltage. The forward bias voltage can then be measured and used to help select the appropriate replacement LED driver.

A further improvement to this process is to then increase the reference current to an additional arbitrary value, measure the load voltage again and compare the change in the forward bias current to the change in the load voltage.

Figure 2:
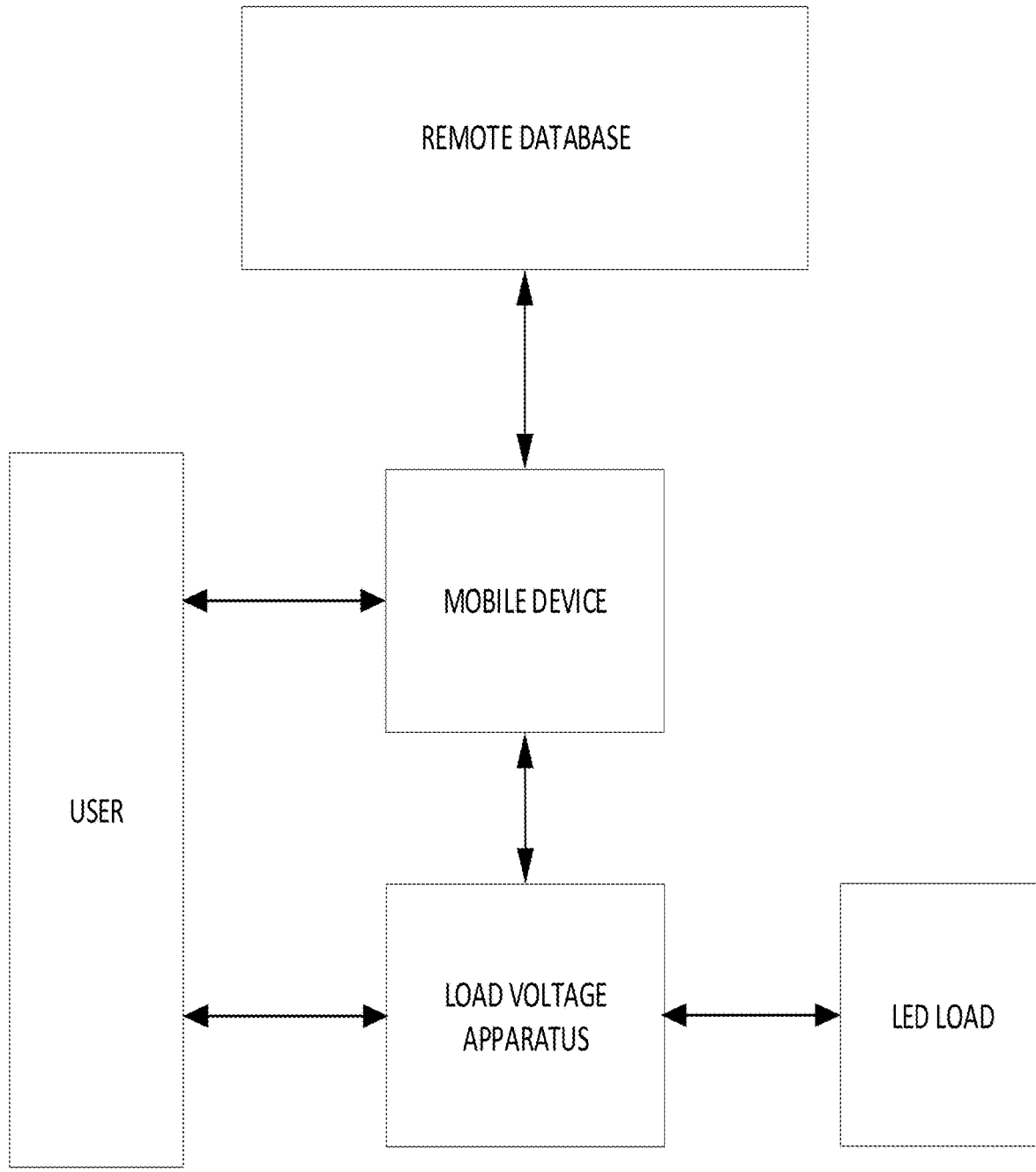
FIG. 2 is an illustration of an example embodiment comprising a system-level configuration including a load detection apparatus.

Combining the forward bias voltage of the LED load with other LED driver data such as the wattage and the output current, the service personnel can then obtain suitable replacement driver options based on commercial data in a database. See FIG. 2, which depicts an example embodiment of a system that provides such a solution. The commercial data can be contained within a specific manufacturer's database or pertinent commercial data can be retrieved from a central database such as a lighting products distributor database.

Figure 3:
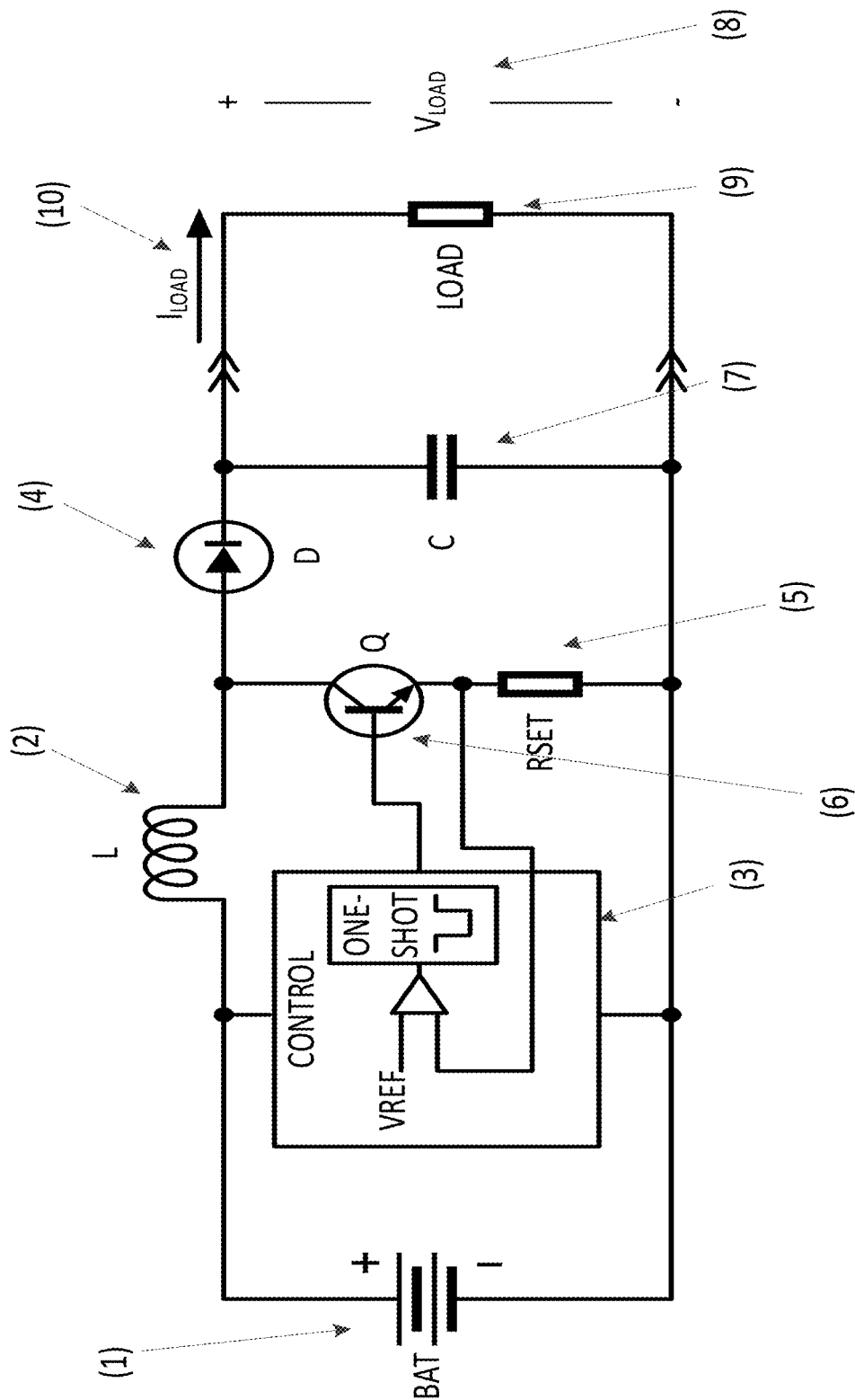
FIG. 3 is an illustration of a boost converter circuit.

Turning to the details of the load voltage detection apparatus portion of the invention, a current sensing pulse frequency modulation (PFM) boost converter solution for determining the forward bias voltage of a load is shown in FIG. 3. In the embodiment shown the PFM boost circuit is powered by a BATTERY POWER SOURCE (1). The battery power source is connected to a BOOST CONTROLLER (3). The boost controller is in turn connected to a BOOST CURRENT SWITCH (6), Q1. In series with the boost controller switch are a BOOST INDUCTOR (2), L1 and a CURRENT SENSE RESISTOR (5), $R_{SET}$. When switch Q1 is on, current builds in inductor L1, to the point that a voltage ($V_{SENSE}$) is developed across RSET that exceeds an arbitrary fixed reference voltage $V_{REF}$. When $V_{REF}$ is exceeded a one-shot monostable circuit transitions to a low state. The monostable circuit has a fixed duration low state which results in Q1 turning off. During the off state, current then flows through RECTIFIER DIODE (4), D1 and into BULK STORAGE CAPACITOR (7), C1. C1 acts as the supply capacitor that supplies LOAD CURRENT (10) to the LOAD (9), which in turn develops a LOAD VOLTAGE (8), $V_{LOAD}$. L1 current decays to $I_{MIN}$. Subsequent to the fixed duration low state the monostable then returns to a high state, turning Q1 back on, causing current to begin to increase once again in L1. Once the voltage developed on C1 is equal to the forward bias voltage of the LED load a steady-state operating condition is reached. Under steady state conditions this basic boost power supply circuit will force a current through the load that is proportional to the current through $R_{SET}$ that will result in the controller turning Q1 off.

As a further explanation of the example embodiment described above, consider an example where it is desired to determine the forward bias voltage of a 12V LED load using a forward bias current of approximately 30 mA. An arbitrary example value of $V_{REF}$ in the controller shown in FIG. 3 is chosen to be 0.02V. Further, to demonstrate the operation of the embodiment described, assume the value for L1 is 100 uH. Further, one skilled in the art can understand that on start-up, all energy is transferred to storage capacitor C1 such that the voltage at C1 increases until a steady state operating condition is reached for $V_{LOAD}$ of 12V.

Observe that in order to achieve a switching point of 0.02V, if $R_{SET}$=0.10, the peak current is 0.02/0.1Ω=200 mA. Using these parameters, the steady state condition will be described.

Figure 4A:
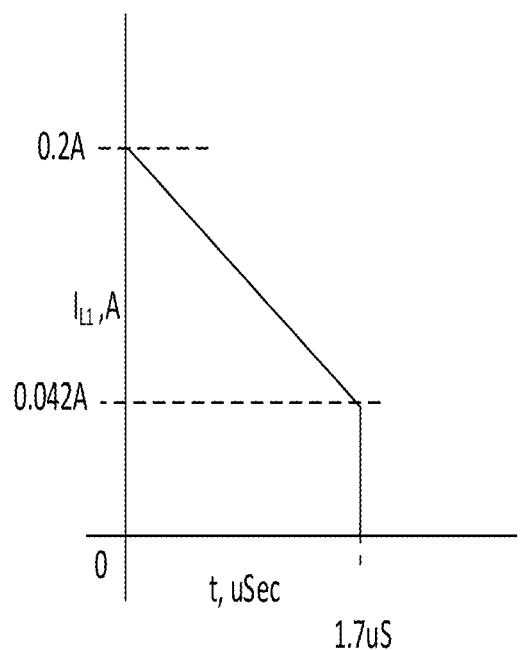
FIG. 4A and FIG. 4B are illustrations of an example boost converter switching current waveforms.

Refer to the L1 current waveform of FIG. 4A, which depicts the decay current of L1 during the off-cycle. Let $t_{OFF}$ be defined as the duration when Q1 is off. Assume that the monostable has a fixed off-time of 1.7 uSec. When Q1 is off, L1 current can be calculated as follows:

$$V_{L1} = L \frac{\Delta I}{t_{OFF}} \quad (1)$$

Assuming steady state and the current in L1 is decaying during the off period, then rearranging the terms in equation 1 yields, $$\Delta I = \frac{t_{OFF}}{L \times V_{L1}} \quad (2)$$

During $t_{OFF}$, $V_{L1}$=−(12−3.3−0.4)V=−9.3V, as diode D1 adds 0.4V to the voltage across L1. Also for $t_{OFF}$=1.7 uSec, L=100 uH. Therefore $$\Delta I = \frac{1.7 \times 10^{-6}}{100 \times 10^{-6} \times 9.3} = 0.1581 A, \quad (3)$$

$$\Delta I = (I_{pk} - I_{min}), \quad (4)$$

$$I_{min} = I_{pk} - \Delta I \quad (5)$$

Or, $I_{min}$=0.0419 A˜0.042 A.

Figure 4B:
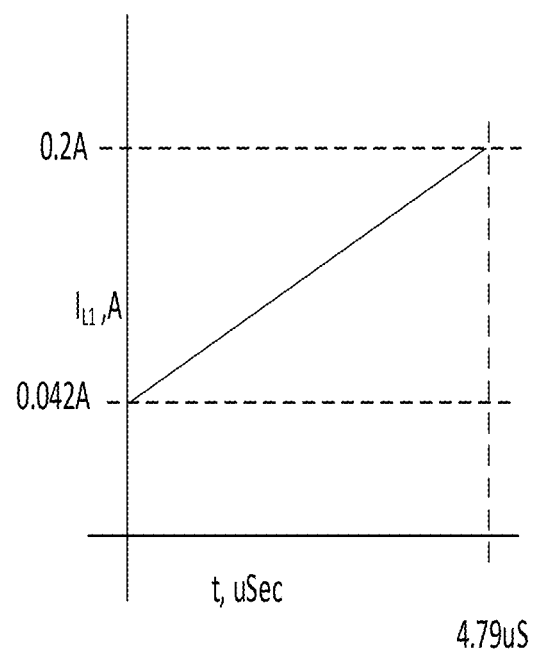

Now, turning to the condition of Q1 during the on-time, refer to FIG. 4B. Returning to equation 1 and recognizing that during the on period of Q1 the total voltage across L1 will only be due to the battery voltage (3.3V), then the only unknown term is $t_{ON}$. Rearranging the terms in equation 1, $$t_{ON} = \frac{\Delta I \times L}{V_{L1}} \quad (6)$$

Substituting in all known values yields $t_{ON}$=4.79 uSec.

Note that this is a periodic signal ($t_{PERIOD}=t_{OFF}+t_{on}$) but that current is only delivered to the load during $t_{OFF}$. Therefore, to determine the average current in the load the current function must be integrated only during the off portion of the period:

$$I_{av} = \frac{1}{(t_{ON}+t_{OFF})}\int_0^{1.7} \frac{(-0.1581t+0.19)}{1.7}dt \quad (7)$$

$$I_{av} = \frac{1}{6.49}\left[\frac{-0.1581t^2}{2\times 1.7} + 0.19t\right] \quad (8)$$

Evaluating the term in brackets in equation 8 from 0 to 1.7 uSec yields $$I_{av}=29 \text{ mA} \quad (9)$$

Based on the above calculations one skilled in the art can appreciate that altering the peak L1 inductor current by either adjusting the value of $V_{REF}$ and/or $R_{SET}$ will in turn change the value of $I_{av}$, the desired forward bias current of the LED load.

Figure 5:
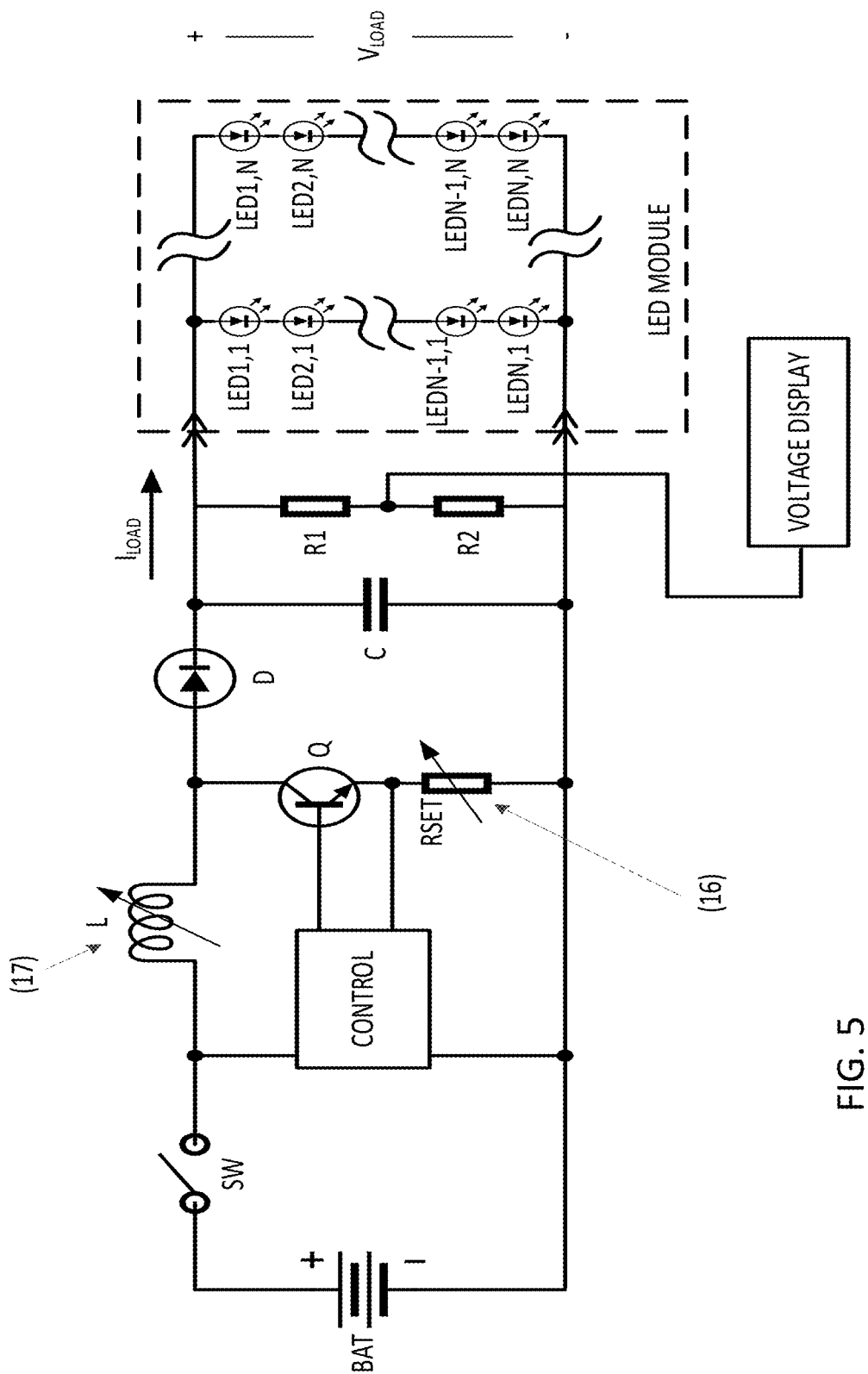
FIG. 5 is an illustration of a boost converter that can be set to detect a threshold current and display a value that is representative of the current.

Based on this principle of operation a properly designed PFM boost controller is an example of a circuit that can be used to detect the forward bias voltage of an LED module. See FIG. 5. Turning to this embodiment, the load is manifested in the form of an LED MODULE (13). Load LED MODULE consists of N parallel LED LOAD LEGS (115), with N LEDs in each leg.

In this embodiment a single pole single throw TEST SWITCH (11), 51, switches electrical energy in the form of battery power to the circuit. As the boost controller switches Q1 on and off proportional to the current through $R_{SET}$, the voltage developed on C1 eventually reaches a point that will forward bias the LED load legs of the LED module. At this point the circuit will reach steady-state with a load current through the LED module at the forward bias voltage that is again proportional to the current through $R_{SET}$. This is the approximate forward bias voltage of the LED module. The forward bias voltage is detected using a RESISTIVE DIVIDER (12), which is compared to a reference voltage in the BOOST CONTROLLER (3). This is a boost controller that has more advanced capabilities, including the ability to compare $V_{SENSE}$ to $V_{REF}$ and drive a VOLTAGE DISPLAY MODULE (14). The difference between $V_{REF}$ and $V_{SENSE}$ is measured in the BOOST CONTROLLER (3) of this embodiment and correlated to the actual forward bias voltage. Note that $I_{LOAD}$ through the LED module can be adjusted by simply changing the value of $R_{SET}$. A typical $I_{LOAD}$ value of 20 mA is sufficient to approximate a forward bias voltage point for many LED modules.

Figure 6:
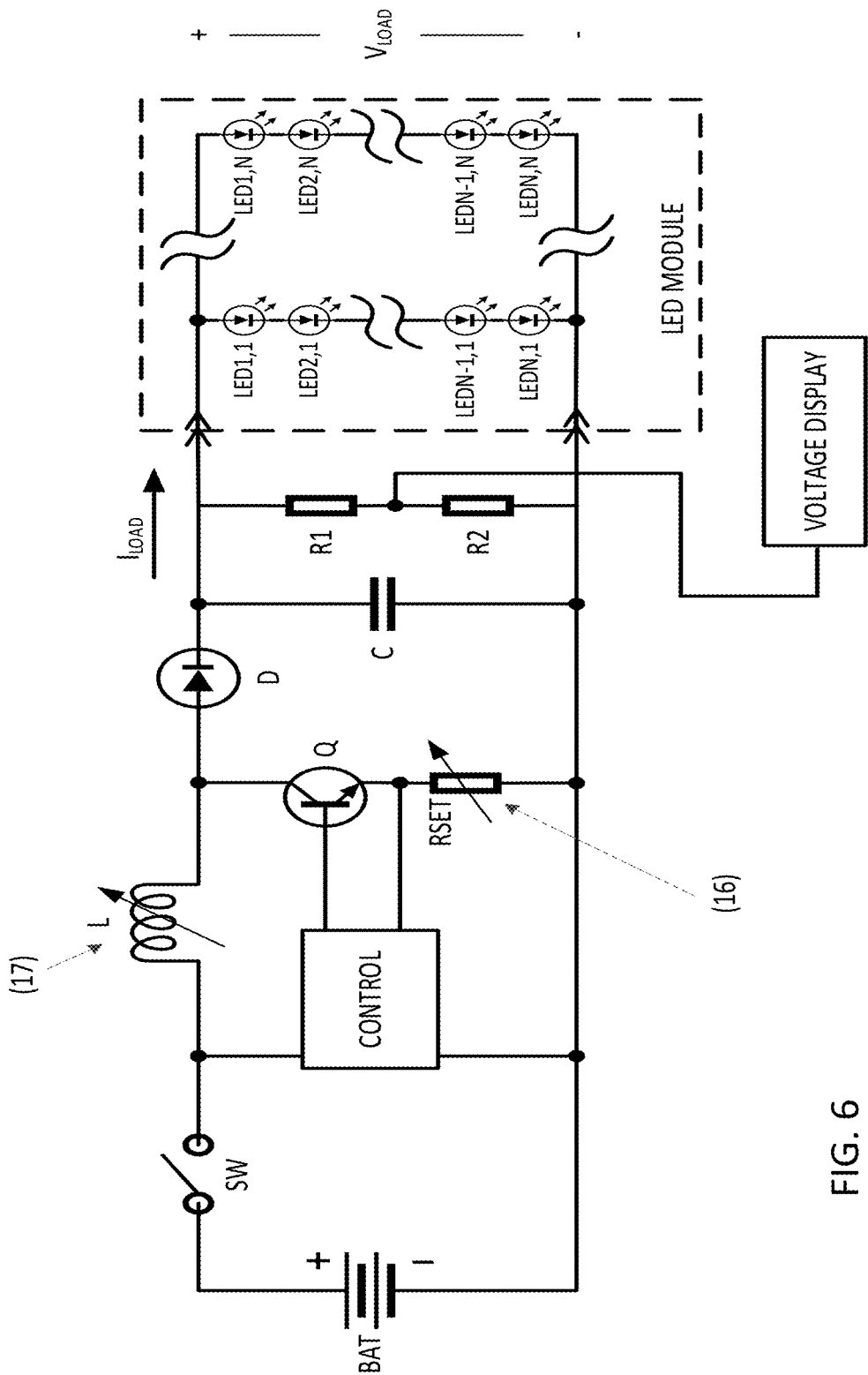
FIG. 6 is an illustration of an example embodiment comprising an adjustable circuit that can be used to determine the forward bias voltage of a connected LED module.

An example embodiment is illustrated in FIG. 6. In some LED modules with many LED load legs a fixed value for $R_{SET}$ that was suitable for smaller LED modules might not be sufficient to establish a forward bias voltage. To more add flexibility for determining the appropriate LED forward bias voltage, the apparatus can permit adjustment of the value of $R_{SET}$ and L during the course of use. This adjustability is provided in the example in the figure by the ADJUSTABLE CURRENT SENSE (16) and ADJUSTABLE INDUCTOR (17). This permits the apparatus, under microprocessor control, to adjust the load current such that a better indication of forward bias voltage can be obtained.

Figure 8:
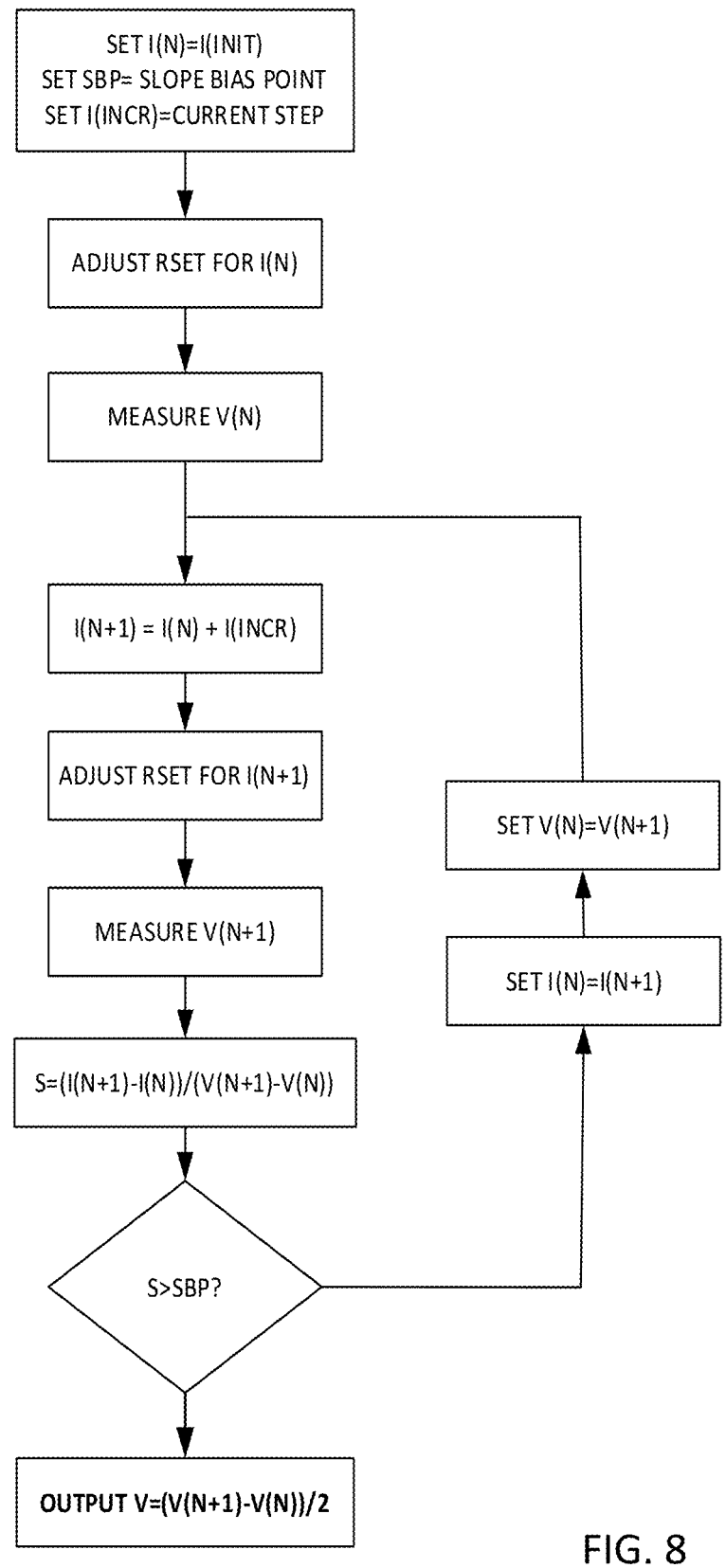
FIG. 8 is a flowchart that illustrates steps of an example method for determining a refined forward bias voltage operating point.

An example method for doing this starts with a specific reference current and measure $V_{SENSE}$ such as in the previously described example. The load current is then incrementally increased, e.g., in fixed size increments, or in increments of different sizes based on the previous determination (e.g., large steps until the comparison indicates nearing the final value). $V_{SENSE}$ is measured at each load current. A slope can be determined. When the slope exceeds a programmed reference slope the midpoint between the two $V_{SENSE}$ points is the desired operating voltage for the LED module. Refer to FIG. 1. Understanding of the method can be facilitated by referring to FIG. 8. In FIG. 8, I(N) is set to an initial current I(INIT), as well as the current step value I(INCR) and the slope to be exceeded. $R_{SET}$ is adjusted to achieve I(INIT). The corresponding load voltage V(N) is measured, e.g., using an apparatus such as those described herein. A loop is then entered whereby I(N) is incremented to I(N+1). V(N+1) is then measured. The slope S is then calculated and compared to the reference slop SBP. If the calculated slope S exceeds SBP, then the LED load is once again considered forward-biased and the forward bias voltage is calculated to be approximately midway between V(N) and V(N+1).

Limits to the load current adjustment include peak current values that L can support without saturation. Other example embodiments can provide further dynamic range by including additional values of L in the invention that can be switched, either manually or under micro-processor control.

Figure 7:
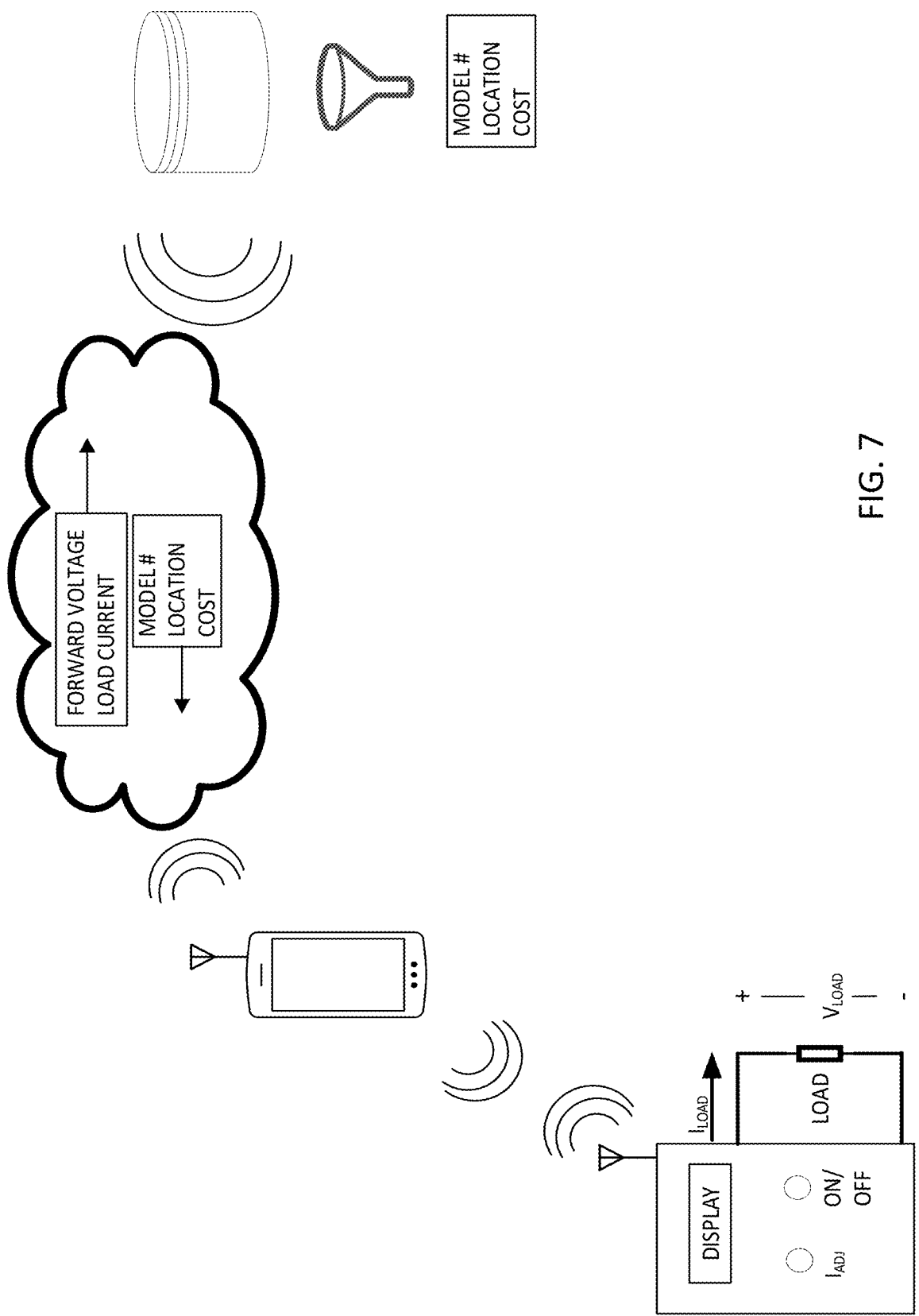
FIG. 7 is an illustration of an example embodiment comprising an apparatus having a wireless linking capability that connects to a central database for receiving pertinent commercial information.

A system-level diagram, providing an example embodiment of the invention, is shown in FIG. 7. The apparatus described above includes the capability to generally connect wirelessly to a central database that has current inventory levels and locations of suitable replacement LED drivers. The apparatus can communicate pertinent operating characteristics to a mobile device, which in turn connects to the database. The database in turn can include a filter function for determining best fit LED drivers. The mobile device can then receive a message that will contain a pertinent commercial data set. This data set can comprise, for example, the suitable replacement LED driver model number(s), inventory level, price and closest location of the replacement driver(s). An example embodiment can include the linking of the apparatus to a mobile device such as a smart phone via any number of wireless linking topologies or direct cabling, which then connects to the remote central database. The remote database can be a specific manufacturer's database or a broader database such as a major lighting distributor. Such embodiments can provide more data entry and data exchange capabilities through a custom application on the mobile device.

The forward bias voltage of the described circuit is described in connection with, but is not limited to, an LED forward bias voltage range of 6V through 60V. Likewise, a suitable reference current to indicate a forward bias voltage for many LED modules on the market is 30 mA, although the invention is not limited to that reference current; other currents can be suitable for other applications.

There are a number of alterations to the boost converter apparatus described in the specific embodiments described herein that can be utilized to forward-bias an LED load system such that the forward bias voltage can be determined. As such, the specific embodiments described should not be construed to limit the approach to said specific embodiment.

Rather, the specific embodiments describe some of many approaches to the invention of the apparatus for determining the forward-bias voltage of any arbitrary load in the field using a simple test circuit and voltage display module as described in the embodiment.

Although the example embodiments are described as battery powered instruments for use in field conditions, neither the specific power source nor the use of it as a field instrument should be considered as limitations of the invention. For example, a laboratory instrument that is supplied power through normal mains can be used to determine the forward bias load voltage of an arbitrary LED module.

Example embodiments of this invention are described herein, including the best mode known to the inventors for carrying out the invention. Variations of those example embodiments will be apparent to those of ordinary skill in the art upon reading the foregoing description. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. An apparatus for determining the forward bias voltage of a diode load, comprising:
   (a) a current source subsystem, configured to connect to a source of electrical power, and configured to supply a variable current via first and second current terminals;
   (b) a rectifier diode, with an input electrically connected to the first current terminal;
   (c) a capacitor, with a first terminal electrically connected to the output of the rectifier diode and a second terminal electrically connected to the second current terminal;
   (d) first and second probe connections, configured to connect to a diode load whose forward bias voltage is to be determined, wherein the first probe connection is electrically connected to the first terminal of the capacitor and the second probe connection is electrically connected to the second terminal of the capacitor;
   wherein the current source subsystem comprises:
   (e) an inductor, with an input terminal configured to electrically connect to a first terminal of the source of electrical power, and an output terminal;
   (f) a boost controller, with a first terminal configured to electrically connect to a first terminal of the source of electrical power and a second terminal configured to electrically connect to a second terminal of the source of electrical power; an input terminal; and a control output terminal;
   (g) a switch, with an input terminal electrically connected to the output terminal of the inductor; and a control input terminal electrically connected to the boost controller control output terminal, and an output terminal;
   (h) a sensing resistor, with an input terminal connected to the switch output terminal; and an output terminal electrically connected to the second terminal of the source of electrical power;
   Wherein the switch input terminal is electrically connected to the first current connection, and the resistor output terminal is electrically connected to the second current connection.

2. The apparatus of claim 1, wherein the boost controller comprises a regulation portion that produces a reference voltage, an internal voltage comparator, and monostable one-shot timing circuit connected to a MOSFET gate drive circuit.

3. The apparatus of claim 1, wherein the inductor has an inductance between 50 uH and 150 uH; and the sensing resistor has a resistance between 0.02 ohms and 2 ohms; and the capacitor has a capacitance between 25 uF and 150 uF.

4. The apparatus of claim 1, wherein the sensing resistor has a resistance that is variable between an upper value and a lower value.

5. The apparatus of claim 1, wherein the inductor has an inductance that is variable between an upper value and a lower value.

6. The apparatus of claim 1, further comprising a user-actuable switch that controls supply of electrical power from the source of electrical power to the apparatus.

7. The apparatus of claim 1, further comprising a resistive divider comprising first and second resistors connected in series between the first and second capacitor terminals, and a voltage indicator electrically connected between the first and second resistors.

8. The apparatus of claim 4, wherein the resistance of the sensing resistor is controlled by a microcontroller.

9. The apparatus of claim 4, wherein the inductance of the inductor is controlled by a microcontroller.

10. The apparatus of claim 1, further comprising a communication facility configured to communicate the forward bias voltage determined by the apparatus to a database containing information concerning available drivers, and indicate one or more drivers matched to the forward bias voltage determined.

11. The apparatus of claim 10, wherein the communication facility considers one or more of price, availability, proximity, in addition to forward bias voltage in indicating a driver.

12. A method of determining a forward bias voltage of an LED load, comprising:
   (a) providing an apparatus as in claim 1;
   (b) using the apparatus to determine the voltage across the LED load at a plurality of currents through the LED load;
   (c) determining two voltages at which the slope of current through the LED load as a function of voltage exceeds a predetermined threshold;
   (d) determining a voltage between the two voltages as the forward bias voltage of the LED load.

13. The method of claim 12, comprising:
   (a) determining a first voltage equal to the voltage across the load at a first current;
   (b) configuring the apparatus to supply a second current;
   (c) determining a second voltage equal to the voltage across the load at the second current;
   (d) determining the slope of current as a function of voltage;
   (e) if the slope exceeds a predetermined threshold, then determining the forward bias voltage as a voltage between the first and second voltage; and if the slope does not exceed the predetermined threshold, then repeating steps (b)-(e) using the second current and the second voltage as the first current and the first voltage.

14. The method of claim 12, wherein determining a voltage between the two voltages comprises determining a voltage that is the average of the two voltage.

15. The method of claim 13, wherein determining the forward bias voltage as a voltage between the first and second voltage comprises determining the forward bias voltage as the average of the first voltage and the second voltage.

16. A method of determining a forward bias voltage of an LED load, comprising:
(a) providing an apparatus as in claim 1;
(b) using the apparatus to determine the voltage across the LED load at a plurality of currents through the LED load;
(c) determining two voltages at which the slope of current through the LED load as a function of voltage exceeds the slope of current through the LED load as a function of voltage determined at voltages above and below the two determined voltages;
(d) determining a voltage between the two determined voltages as the forward bias voltage of the LED load.

* * * * *